(12) United States Patent
Ohnuki

(10) Patent No.: US 7,990,154 B2
(45) Date of Patent: Aug. 2, 2011

(54) CELL VOLTAGE DETECTING APPARATUS

(75) Inventor: Yasumichi Ohnuki, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 428 days.

(21) Appl. No.: 12/324,075

(22) Filed: Nov. 26, 2008

(65) Prior Publication Data

US 2009/0140743 A1 Jun. 4, 2009

(30) Foreign Application Priority Data

Nov. 29, 2007 (JP) ................................. 2007-309021

(51) Int. Cl.
*G01N 27/416* (2006.01)
(52) U.S. Cl. ...................................................... 324/426
(58) Field of Classification Search .................... 324/426
See application file for complete search history.

(56) References Cited

U.S. PATENT DOCUMENTS 6,255,826 B1 * 7/2001 Ohsawa et al. ............... 324/426
6,803,766 B2 * 10/2004 Kobayashi et al. ........... 324/434

FOREIGN PATENT DOCUMENTS

| JP | 09-318679 A | 12/1997 |
| JP | 11-160371 A | 6/1999 |
| JP | 3721839 B2 | 9/2005 |

OTHER PUBLICATIONS

"Guidelines for Electric Vehicle—SAE J2344"; Jun. 1998; pp. 23.590-23.593.
Michio Okamura;"Operational Amplifier Constant Current Circuit"; CQ Publishing Co., Ltd.; Tokyo, Japan; pp. 252-257.

* cited by examiner

*Primary Examiner* — Ha Tran T Nguyen
*Assistant Examiner* — Tung X Nguyen
(74) *Attorney, Agent, or Firm* — Arent Fox LLP

(57) ABSTRACT

The present invention provides an easy to produce cell voltage detecting apparatus using a semiconductor having low voltage endurance. In the cell voltage detecting apparatus, cell modules B1-B10 are serially connected, a switch SW1 is located at a middle point, and a contact point of the switch SW1 on a higher potential side is set to a reference potential (ground). Each of discharge type constant current circuits VC1-VC10 is connected to each of the cell modules B1-B10, and each of current-voltage converter circuits CV1-CV10 is connected to each of the discharge type constant current circuits VC1-VC10. Also, diodes D6-D10 are connected respectively so as to allow a current to flow in a direction from the current-voltage converter circuits SV6-SV10 to the corresponding induction type constant current circuits VS6-VS10.

4 Claims, 8 Drawing Sheets

CELL VOLTAGE DETECTING APPARATUS

CROSS REFERENCE TO RELATED APPLICATIONS

The present application claims benefit of the filing date of Japanese Patent Application No. 2007-309021 filed on Nov. 29, 2007 which is incorporated herein by reference.

FIELD OF THE INVENTION

The present invention relates to a cell voltage detecting apparatus for detecting voltage across terminals of a cell module in which cells are connected in series, and more particularly, to the cell voltage detecting apparatus for detecting voltage by converting voltage across the cell module into current.

DESCRIPTION OF THE RELATED ART

Vehicles having traveling motors such as electric cars and hybrid cars are equipped with battery packs each of which is made up of a plurality of serially connected cell modules each of which is made up of a plurality of serially connected cells so as to supply power to the motor. In the battery pack, the charged state of each of a plurality of cell modules may be different each other after repeated charging/discharging. For this reason, each of voltages (module voltage) across the cell modules is monitored.

In order to detect the module voltages across these cell modules, an operational amplifier is used so as to convert the module voltage of each cell module into a constant current which is proportional to the module voltage, and so as to convert the constant current into the voltage again (see, for example, "Design of OP AMP Circuit", by Michio OKAMURA, published by CQ Publishing Co., Ltd., Tokyo, Japan, pp. 252-257). In this detecting method, a constant current circuit including an operational amplifier, etc. is used so as to precisely send/receive analog quantities between circuits having different potentials such as the cell modules in which cells are serially connected, etc.

Also, it is well known that a "cell voltage detecting circuit" detects the cell voltage of the battery pack by converting the cell voltage of the battery pack into a current using the constant current circuit, allowing this current to pass through a resistor with reference to a minus terminal (ground terminal) of the battery pack, and measuring a voltage across the terminals of the resistor so as to detect the cell voltage (for example, see JP 3721839 B2 ([0035]-[0046], FIG. 2)).

Also, in the battery packs of electric cars and hybrid cars, a manual service plug or switch is often provided near the center of the serially connected cell modules. This service plug or switch electrically divides the serially connected cells near the center of the battery pack to divide a voltage across the battery pack in half so as to facilitate handling the battery pack at the time of maintenance. Consequently, there is a standard which recommends to provide the switch, etc. at the center of the battery pack (for example, see SAE J2344 (Guidelines for Electric Vehicle Safety)).

However, because the cell voltage across the cell is detected by allowing a constant current to pass through a resistor used for detecting voltage with reference to a minus terminal (ground terminal) of the battery pack in the "cell voltage detecting circuit" (see JP 3721839 B2 ([0035]-[0046], FIG. 2)), a total voltage of the battery pack (for example, in the case of the battery pack including ten cells, 200 volts), not each cell voltage across the cell (e.g., 20 volts), is applied to each semiconductor device (e.g., P-channel MOS FET) which constitutes the constant current circuit. For this reason, a power semiconductor device driven by the operational amplifier needs to have enough voltage endurance (source-to-drain voltage endurance) to endure the total voltage of the battery pack (200 volts). However, a problem arises that the P-channel power MOS FETs having voltage endurance over 200 volts are generally expensive because such P-channel power MOS FETs are limited in model numbers and production volume.

Further, as defined in the SAE J2344, in the case where a switch is provided near the center of the cell modules which constitute the battery pack to cut off the cell modules, if some load is connected between an upper terminal and a lower terminal of the battery pack, an upper end potential of the battery pack becomes zero when a lower end potential of the battery pack is made to be zero. As a result, the potential of a connection point just above a cut-off point by the switch (i.e., the minus terminal of the cell module just above the cut-off point by the switch) becomes less than zero (e.g., −100 volts). Accordingly, in the case where a discharge type constant current circuit is used to detect the voltage of the cell module, a problem arises that an unnecessary discharge of the cell occurs because the current of the cell module continues passing through a discharge type constant current circuit when the switch is turned off. Also, for example, a protection circuit is needed to be added because a voltage which is out of range of a power supply voltage may be applied to terminals of the operational amplifier used in the constant current circuit and a current-voltage converter circuit. As a method for adding the protection circuit, a voltage limiting device such as a zener diode, etc. may be connected to each terminals of the operational amplifier. However, a problem arises that voltage measurement accuracy is deteriorated by a leakage current of the added device.

In view of the foregoing, an object of the present invention is to provide a low cost and easy to produce cell voltage detecting apparatus using a semiconductor having low voltage endurance. Another object of the present invention is to provide a cell voltage detecting apparatus which suppresses unnecessary discharge current which continues passing through the cell module when the switch at the center of the battery pack is turned off.

SUMMARY OF THE INVENTION

In order to achieve the above objects, in accordance with a first aspect of the present invention, there is provided a cell module voltage detecting apparatus connected to a battery pack made up of a plurality of serially connected cell modules each of which is made up of one or more cells, for detecting a voltage between terminals of the cell module including: discharge type constant current circuits where any one of mutual connection points of the cell modules except both ends of the battery pack is used as a middle point, a potential of the middle point is set to a reference potential, each of the discharge type constant current circuits is provided for each of the cell modules on a higher potential side of the middle point and outputs a current representative of a voltage of the cell module; first current-voltage converter circuits each of which is provided for each of the discharge type constant current circuits and converts the current outputted from the discharge type constant current circuit to a voltage; induction type constant current circuits each of which is provided for each of the cell modules on a lower potential side of the middle point and outputs a current representative of a voltage of the cell module; and second current-voltage converter circuits each of which is provided for each of the induction type constant current circuits and converts a current outputted from the induction type constant current circuit to a voltage.

According to the first aspect of the present invention, an approximately middle point except both ends of the battery pack is set to the reference potential (ground), and corresponding to each of the cell modules on the higher potential side of the middle point, the discharge type constant current circuit and the current-voltage converter circuit which converts a current outputted from the discharge type constant current circuit to a voltage are provided. Further, corresponding to each of the cell modules on the lower potential side of the middle point, the induction type constant current circuit and the current-voltage converter circuit which converts a current inputted into the induction type constant current circuit into a voltage. Therefore, because only a lower voltage (for example, half of the total voltage) than the total voltage of the battery pack in which all cell modules are serially connected is applied to a semiconductor used in the discharge type constant current circuit or the induction type constant current circuit, the semiconductor having relatively low voltage endurance may be used.

In addition, the middle point of the battery pack which is set to the reference potential is any one of mutual connection points of the cell module except both ends of the battery pack. Preferably, a plurality of serially connected cell modules are evenly or approximately evenly divided on opposite sides of this middle point.

Preferably, according to a second aspect of the present invention, in addition to the first aspect, there is provided the cell module voltage detecting apparatus further including: a cut-off switch provided between the middle point and a terminal of the cell module on the lower potential side of the middle point; and diodes each of which is inserted between the induction type constant current circuit and the current-voltage converter circuit for locating a cathode at an output terminal of the induction type constant current circuit, and for locating an anode at an input terminal of the current-voltage converter circuit.

That is, in the case where the reference potential (ground) is provided on the higher potential side of the switch located at the middle point of the cell modules which constitute the battery pack, if the diode to allow a current to pass in a direction from the current-voltage converter circuit to the corresponding induction type constant current circuit is located between the induction type constant current circuit on the lower potential side of the switch and the current-voltage converter circuit, an unnecessary discharge current passing through the cell modules is suppressed when the switch is turned off.

Also, preferably, according to a third aspect of the present invention, in addition to the first aspect, there is provided the cell module voltage detecting apparatus further including: a cut-off switch provided between the middle point and a terminal of the cell module on the higher potential side of the middle point; and diodes each of which is inserted between the discharge type constant current circuit and the current-voltage converter circuit for locating an anode at an output terminal of the discharge type constant current circuit, and for locating a cathode at an input terminal of the current-voltage converter circuit.

That is, in the case where the reference potential (ground) is provided on the lower potential side of the switch located at the middle point of the cell modules which constitute the battery pack, if the diode to allow a current to pass in a direction from the discharge type constant current circuit to the corresponding current-voltage converter circuit is located between the discharge type constant current circuit on the higher potential side of the switch and the current-voltage converter circuit, an unnecessary discharge current passing through the cell modules is suppressed when the switch is turned off.

Also, in accordance with a fourth aspect of the present invention, there is provided a cell module voltage detecting apparatus connected to a battery pack made up of a plurality of serially connected cell modules each of which is made up of one or more cells, for detecting a voltage between terminals of the cell module including: discharge type constant current circuits where one terminal having the lowest potential of all is set to the reference potential, any one of mutual connection points of the cell modules except both ends of the battery pack is used as a middle point, a cut-off switch is provided at the middle point, each of the discharge type constant current circuits is provided for each of the cell modules and outputs a current representative of a voltage of the cell module; current-voltage converter circuits each of which is provided for each of the discharge type constant current circuits and converts the current outputted from the discharge type constant current circuit into a voltage; and diodes each of which is inserted between an output terminal of the discharge type constant current circuit connected to the cell module on the lower potential side of the middle point and the current-voltage converter circuit connected to the discharge type constant current circuit for locating an anode at an output terminal of the discharge type constant current circuit, and for locating a cathode at an input terminal of the current-voltage converter circuit.

That is, in the case where the switch is provided at the middle point of a plurality of serially connected cell modules, and where the discharge type constant current circuit and the current-voltage converter circuit are provided for each of a plurality of cell modules, if the diode to allow a current to pass in a direction from the discharge type constant current circuits to the corresponding current-voltage converter circuit is connected, an unnecessary discharge current passing through the cell modules is suppressed when the switch is turned off.

BRIEF DESCRIPTION OF THE DRAWINGS

The object and features of the present invention will become more readily apparent from the following detailed description taken in conjunction with the accompanying drawings in which.

DETAILED DESCRIPTION OF THE INVENTION

The above and other advantages of the invention will become more apparent in the following description and the accompanying drawings in which like numerals refer like parts.

First Embodiment

Figure 1:
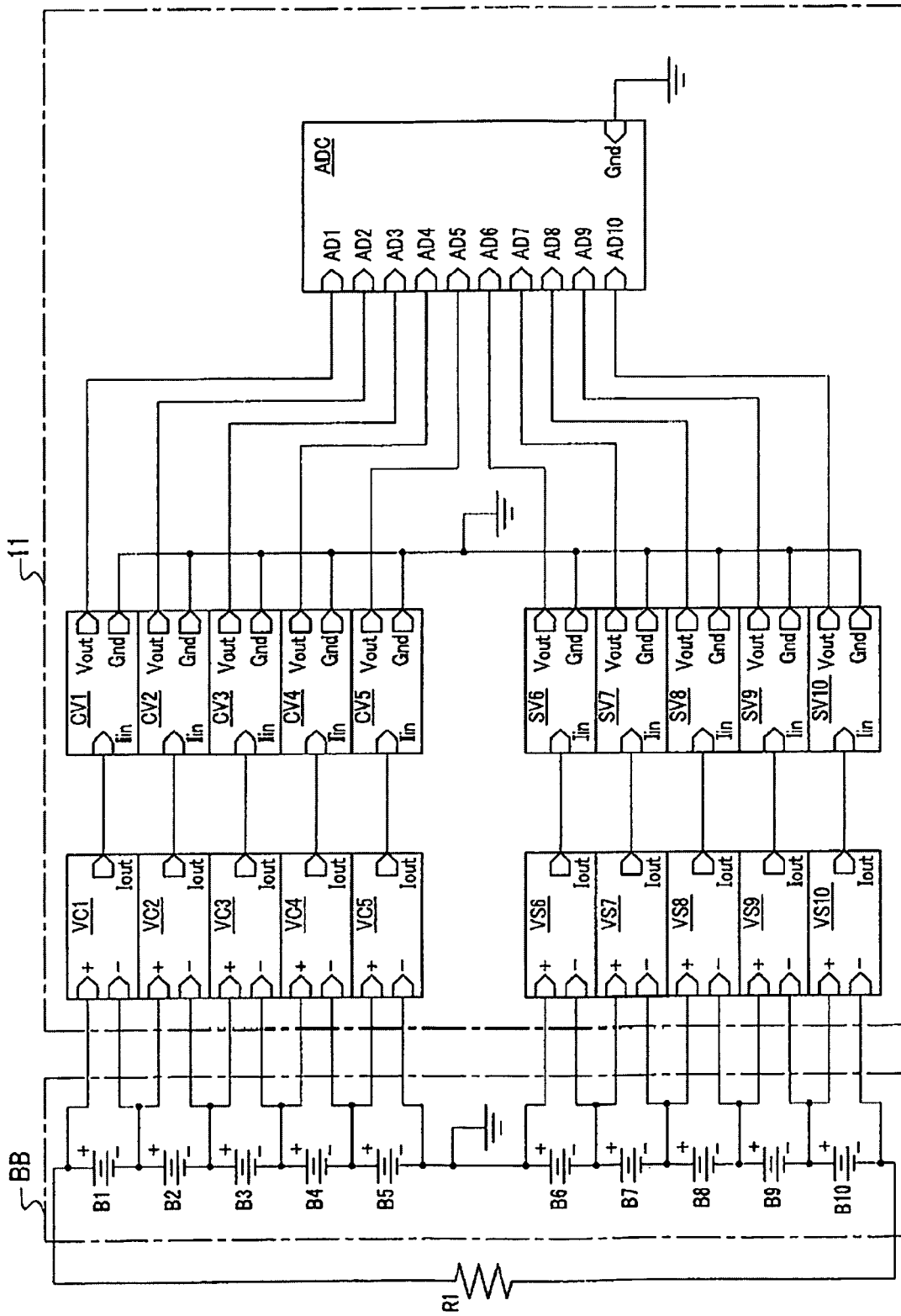
FIG. 1 is a block diagram of a cell voltage detecting circuit of a first embodiment according to the present invention.

FIG. 1 is a block diagram of a cell voltage detecting circuit 11 of a first embodiment according to the present invention.

A battery pack BB is a detected object by the cell voltage detecting circuit 11, and is made up of serially connected cell modules B1, B2, ..., B10. Each of the cell modules B1, B2, ..., B10 is made up of one or a given number of serially connected cells. Therefore, a plus terminal of the cell module at the highest potential is also a plus terminal of the battery pack BB, and a minus terminal of the cell module at the lowest potential is also a minus terminal of the battery pack BB.

The middle point of the cell modules B1, B2, ..., B10 (in this case, a connection point between the cell module B5 and the cell module B6) is connected to a grounded (GND), and the potential of GND is set to a reference potential. Preferably, the connection point set to the reference potential is at or near a connection point (connection portion) which divides the voltage across the battery pack BB or the number of cell modules in half. However, any one of connection point except both ends of the battery pack BB may be used as the middle point, and the potential of the middle point may be set to the reference potential.

The cell voltage detecting circuit 11 is used to detect each voltage of the cell modules B1, B2, ..., B10 (module voltages V1, V2, V10). The cell voltage detecting circuit 11 is provided with the discharge type constant current circuits VC1-VC5 each of which is connected to each of the cell modules B1-B5 on the higher potential side, and the induction type constant current circuits VS6-VS10 each of which is connected to each of the cell modules B6-B10.

In the cell voltage detecting circuit 11, each of the discharge type constant current circuits VC1-VC5 is further connected to each of the current-voltage converter circuits CV1-CV5, and each of the induction type constant current circuits VS6-VS10 is also connected to each of the current-voltage converter circuits SV6-SV10. And, detection signals are outputted from the current-voltage converter circuits CV1-SV10 to module voltage monitoring terminals AD1-AD10 of a voltage monitoring circuit ADC respectively. In addition, a resistor R1 which simulates a load of the battery pack BB is connected between a plus terminal of the cell module B1 at the highest potential of the battery pack BB and a minus terminal of the cell module B10 at the lowest potential (i.e., both ends of the battery pack BB).

Figure 2:
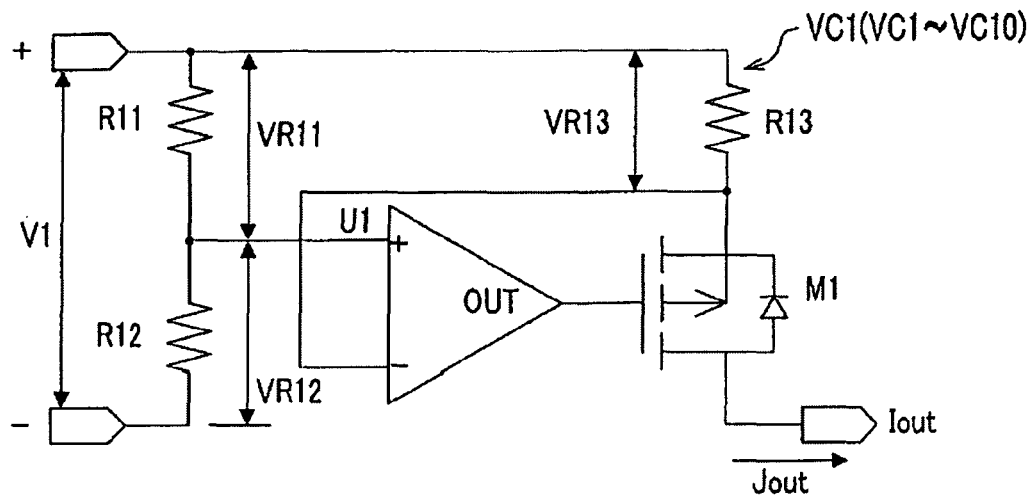
FIG. 2 is a circuit diagram of the discharge type constant current circuit.

FIG. 2 is a circuit diagram of the discharge type constant current circuit VC1. The discharge type constant current circuits VC2, VC3, VC10 may have the same configuration as that of the discharge type constant current circuit VC1. The discharge type constant current circuit VC1 is provided with a P-channel FET (Ml) as an output device.

In the discharge type constant current circuit VC1, the module voltage V1 of the cell module B1 is divided by resistors R11 and R12, and a current having a value of (divided voltage VR11/resistor R13) flows through the P-channel FET (M1). In this way, through the P-channel FET (M1), an output current Jout, which is proportional to the module voltage V1 of the cell module B1, is outputted from an output terminal Iout of the discharge type constant current circuit VC1.

Figure 3A:
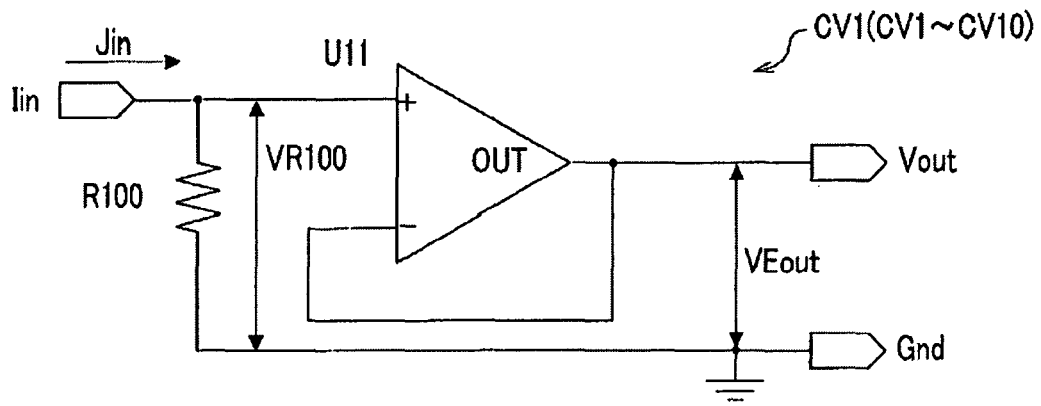
FIG. 3A is a first example circuit diagram of the current-voltage converter circuit corresponding to the discharge type constant current circuit shown in FIG. 2.

FIG. 3A is a first example circuit diagram of the current-voltage converter circuit CV1 corresponding to the discharge type constant current circuit VC1 shown in FIG. 2 (if necessary, see FIG. 1). The current-voltage converter circuits CV2, CV3, ..., CV10 may have the same configuration as that of the current-voltage converter circuit CV1.

The output current Jout is outputted from an output terminal Iout of the discharge type constant current circuit VC1 (see FIG. 2), and is inputted to an input terminal 1in of the current-voltage converter circuit CV1. And, the output current Jout flows into GND through a resistor R100. A voltage VR100, which is generated by allowing an input current Jin to pass through the resistor R100, is inputted to a plus terminal of an operational amplifier U11, and an output voltage VEout, which is proportional to the output current Jout, is outputted from an output terminal OUT of the operational amplifier U11. In this way, an output voltage VEout, which is proportional to the output current Jout of the discharge type constant current circuit VC1, is outputted from an output terminal Vout of the current-voltage converter circuit CV1. That is, the output voltage VEout, which is proportional to the module voltage V1 of the cell module B1, is outputted from the output terminal Vout of the current-voltage converter circuit CV1, where the VEout means a potential difference between the output terminal Vout and GND.

Figure 3B:
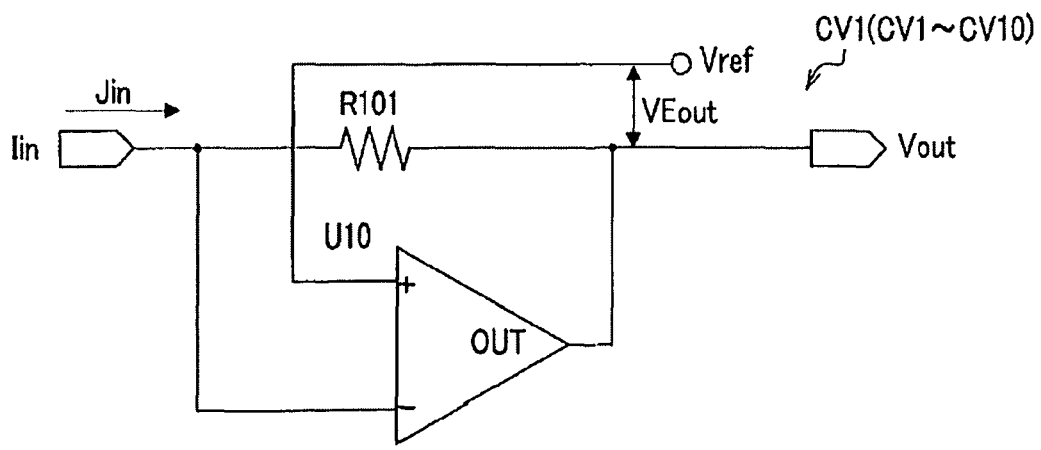
FIG. 3B is a second example circuit diagram of the current-voltage converter circuit corresponding to the discharge type constant current circuit shown in FIG. 2.

FIG. 3B is a second example circuit diagram of the current-voltage converter circuit CV1 corresponding to the discharge type constant current circuit VC1. The current-voltage converter circuits CV2, CV3, ..., CV10 may have the same configuration as that of the current-voltage converter circuit CV1.

Although the first example of the current-voltage converter circuit CV1 shown in FIG. 3A detects the output voltage VEout, which is proportional to the output current Jout of the discharge type constant current circuit VC1, with the resistor R100, the second example of the current-voltage converter circuit CV1 shown in FIG. 3B detects the output voltage VEout, which is proportional to the output current Jout of the discharge type constant current circuit VC1, with a resistor R101, where VEout means a potential difference between a Vref and the Vout terminal.

When the discharge type constant current circuit VC1 shown in FIG. 2 and the current-voltage converter circuit CV1 shown in FIG. 3A or FIG. 3B are used in combination, if a voltage-current converting accuracy of the discharge type constant current circuit VC1 and a current-voltage converting accuracy of the current-voltage converter circuit CV1 are high enough, it is possible to detect each module voltages V1, V2, ..., V10 of the cell modules B1, B2, ..., B10 with a high degree of accuracy in spite of high or low total voltage across the battery pack BB.

Figure 4:
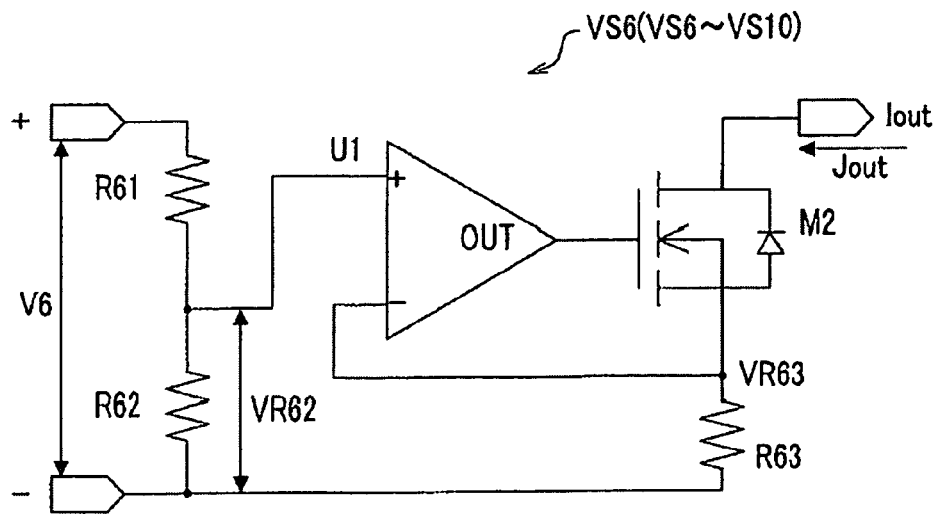
FIG. 4 is a circuit diagram of the induction type constant current circuit.

FIG. 4 is a circuit diagram of the induction type constant current circuit VS6. The induction type constant current circuits VS7, VS8, ..., VS10 may have the same configuration as that of the induction type constant current circuit VS6. The induction type constant current circuit VS6 is provided with a N-channel FET (M2) as an output device.

In the induction type constant current circuit VS6, the module voltage V6 of the cell module B6 is divided by resistors R61 and R62, and a current having a value of (divided voltage VR62/resistor R63) flows through the N-channel FET (M2). In this way, through the N-channel FET (M2), an output current Jout, which is proportional to the module voltage V6 of the cell module B6, is induced into an output terminal Iout.

Figure 5A:
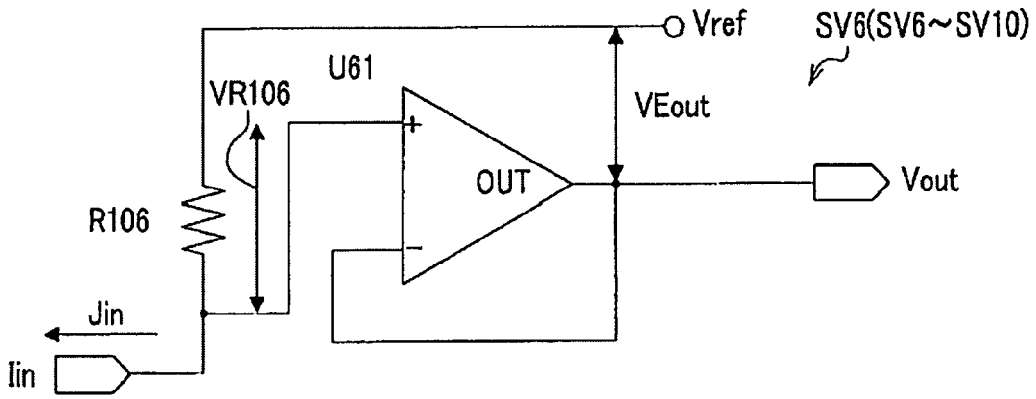
FIG. 5A is a first example circuit diagram of the current-voltage converter circuit corresponding to the induction type constant current circuit shown in FIG. 4.

FIG. 5A is a first example circuit diagram of the current-voltage converter circuit SV6 corresponding to the induction type constant current circuit VS6 shown in FIG. 4. The current-voltage converter circuits SV7-SV10 may have the same configuration as that of the current-voltage converter circuit SV6.

The output current Jout is induced into the output terminal Iout of the induction type constant current circuit VS6 (see FIG. 4), and is inputted to an input terminal Iin of the current-voltage converter circuit SV6 as an input current Jin. And, in the current-voltage converter circuit SV6, because a voltage VR106 between terminals of a resistor R106 generated by the input current Jin is inputted to a plus terminal of an operational amplifier U61, an output voltage VEout, which is proportional to the output current Jout of the induction type constant current circuit VS6, is outputted from the output terminal Vout of the current-voltage converter circuit SV6. Referring back to FIG. 1, in this way, the output voltage VEout, which is proportional to the module voltage V6 of the cell module B6, is outputted from the output terminal Vout of the current-voltage converter circuit SV6, where the VEout means a potential difference between a Vref and the Vout terminal.

Figure 5B:
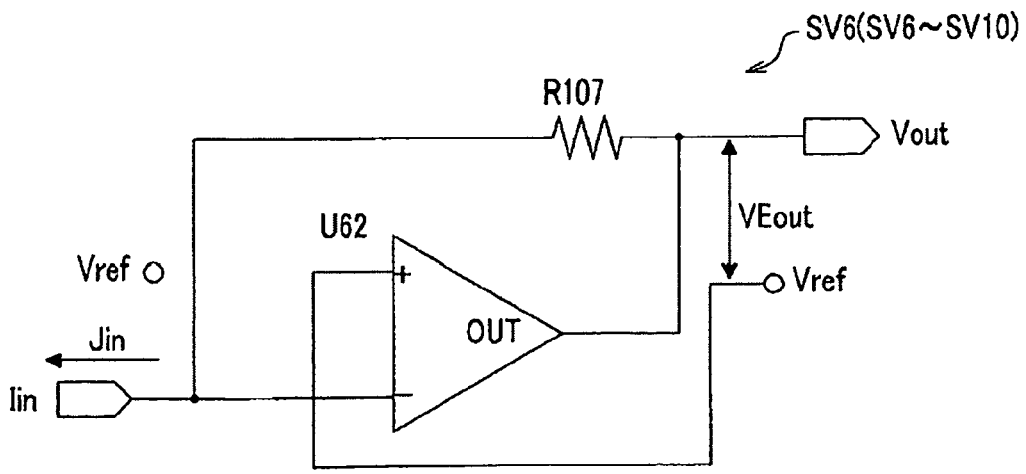
FIG. 5B is a second example circuit diagram of the current-voltage converter circuit corresponding to the induction type constant current circuit shown in FIG. 4.

FIG. 5B is a second example circuit diagram of the current-voltage converter circuit SV6 corresponding to the induction type constant current circuit VS6 shown in FIG. 4. The current-voltage converter circuits SV7-SV10 may have the same configuration as that of the current-voltage converter circuit SV6.

The output current Jout is induced into the output terminal Iout of the induction type constant current circuit VS6 (see FIG. 4), and is inputted to the input terminal Iin of the current-voltage converter circuit SV6 as an input current Jin. And, in the current-voltage converter circuit SV6, a voltage VR107 between terminals of a resistor R107 is generated by the input current Jin, and the output voltage VEout, which is proportional to the voltage VR107 between terminals, is outputted. Referring back to FIG. 1, in this way, the output voltage VEout, which is proportional to the module voltage V6 of the cell module B6, is outputted from the output terminal Vout of the current-voltage converter circuit SV6, where the VEout means a potential difference between the Vout terminal and a Vref.

As shown in FIG. 1, when the module voltage V1 of the cell module B1 at the highest potential of the battery pack BB is inputted to the discharge type constant current circuit VC1, a gate voltage of the P-channel FET (M1) is controlled by the operation of the operational amplifier U1 shown in FIG. 2 to output the output current Jout expressed by a following equation (1) from the output terminal Iout of the discharge type constant current circuit VC1.

$$Jout=[V1*\{R11/(R11+R12)\}]/R13 \quad (1)$$

Next, in the first example of the current-voltage converter circuit CV1 shown in FIG. 3A, because the output current Jout flows through the resistor R100, the potential difference VEout between the output terminal Vout of a voltage follower circuit, which is made up of an operational amplifier U11, and GND is expressed by a following equation (2).

$$VEout = R100*Jout \quad (2)$$
$$= [R100*V1*\{R11/(R11+R12)\}]/R13$$

That is, as can be seen from the equation (2), the module voltage V1 of the cell module B1 can be known from the output voltage VEout of the current-voltage converter circuit CV1. Likewise, the module voltages V2-V5 of the cell modules B2-B5 can be known from the output voltages VEout of the current-voltage converter circuits CV2-CV5.

On the other hand, in the second example of the current-voltage converter circuit CV1 shown in FIG. 3B, any one voltage within the range of a source voltage of an operational amplifier U10 is set to the Vref, and the potential difference VEout between the Vref and the output terminal Vout of the operational amplifier U10 is expressed by a following equation (3).

$$VEout=Vref-[R101*V1*\{R11/(R11+R12)\}]/R13 \quad (3)$$

That is, as can be seen from the equation (3), the module voltage V1 of the cell module B1 can be measured from the output voltage VEout of the current-voltage converter circuit CV1. Likewise, the module voltages V2-V5 of the cell modules B2-B5 can be measured form the output voltages VEout of the current-voltage converter circuits CV2-CV5.

At this time, because the minus terminal of the cell module B5 at the lowest potential of the five cell modules B1-B5 is set to GND, when each module voltage of the cell modules B1-B5 is set to 20 volts, a voltage on the order of only 100 volts is applied between a source and a drain of the P-channel FET (M1) of the discharge type constant current circuit VC1 at the highest potential. Therefore, a voltage endurance of a semiconductor device of the discharge type constant current circuit VC1 may be half of that of a prior cell voltage detecting circuit 21 shown in FIG. 9.

On the other hand, as shown in FIG. 1, each of the cell modules B6-B10 on the lower potential side uses each of the induction type constant current circuits VS6-VS10. In the induction type constant current circuit shown in FIG. 4, when the module voltage V10 of the cell module B10 at the lowest potential is inputted to the induction type constant current circuit VS10, a gate voltage of the N-channel FET (M2) is adjusted by the operation of the operational amplifier U1 to output the output current Jout expressed by a following equation (4) from the output terminal Iout of the induction type constant current circuit VS10.

$$Iout=V10*R62/(R61+R62)/R63 \quad (4)$$

Next, in the current-voltage converter circuit shown in FIG. 5A, because the above described output current Jout flows through the resistor R106, when any one voltage within the range of a source voltage of an operational amplifier U61 is set to the Vref, the potential difference VEout between the Vref and the output terminal Vout of the voltage follower circuit which is made up of the operational amplifier U61 is expressed by a following equation (5).

$$VEout=R106*V10*R62/(R61+R62)/R63 \quad (5)$$

That is, as can be seen from the equation (5), the module voltage V10 of the cell module B10 can be measured from the output voltage VEout of the current-voltage converter circuit SV10. Likewise, the module voltages V6-V9 of the cell modules B6-B9 can be measured from the output voltages VEout of the current-voltage converter circuits SV6-SV10.

On the other hand, in the current-voltage converter circuit SV6 shown in FIG. 5B, when any one voltage within the range of a source voltage of an operational amplifier U62 is set to the Vref, the potential difference VEout between the Vref and the output terminal Vout of the operational amplifier U62 is expressed by a following equation (6).

$$VEout=[R107*V10*\{R61/(R61+R62)\}]/R63 \qquad (6)$$

Here, when each module voltage is set to 20 volts, a voltage of 100 volts is applied between a source and a drain of the N-channel FET (M2) of the induction type constant current circuit VS10 at the lowest potential of the battery pack BB. Therefore, a voltage endurance of a semiconductor device (N-channel FET) of the induction type constant current circuit VS10 (see FIG. 4) may be half of that of the cell voltage detecting circuit 21 of below described first comparative example with reference to FIG. 9.

In addition, instead of the P-channel FET (M1), a PNP-type small signal bipolar transistor and a NPN-type power bipolar transistor may be used in combination as a Darlington circuit. In this configuration, two bipolar transistors can be treated as one PNP-type bipolar transistor. In this case, because a current amplification factor can be obtained by a product of those of the two transistor, a base current can be relatively reduced. Likewise, instead of the N-channel FET (M2), a NPN-type small signal bipolar transistor and a NPN-type power bipolar transistor may be used in combination as a Darlington circuit. In this case, likewise, the same effect as above can be obtained.

According to the cell voltage detecting circuit 11 of the first embodiment, a voltage applied to a discharge type constant current circuit VCn can be reduced, and the circuit can be realized using a semiconductor device having low voltage endurance.

Second Embodiment

Figure 6:
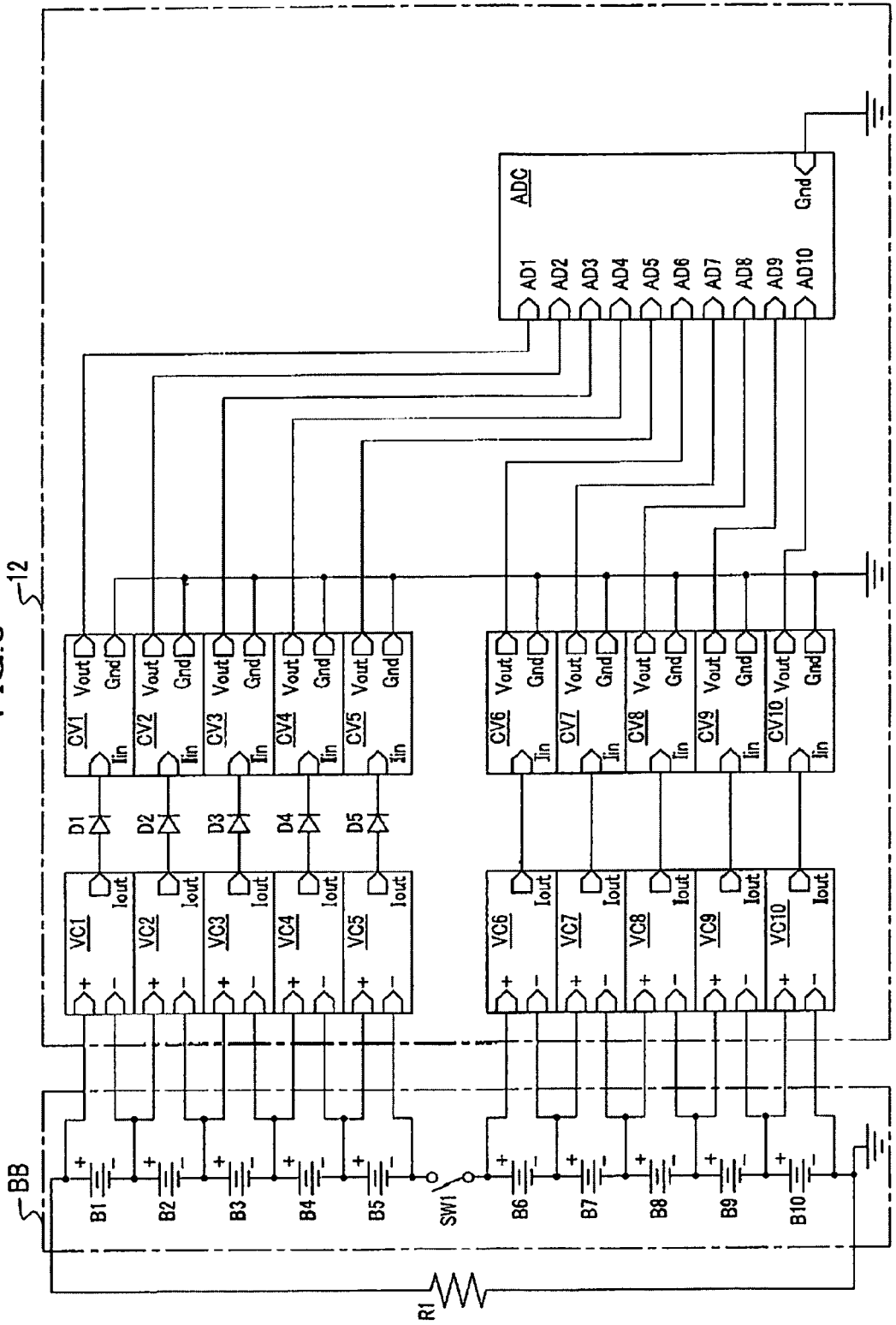
FIG. 6 is a block diagram of a cell voltage detecting circuit of a second embodiment according to the present invention.

FIG. 6 is a block diagram of a cell voltage detecting circuit 12 of a second embodiment according to the present invention.

In the cell voltage detecting circuit 12, backflow prevention diodes D1-D5 are inserted so as to allow currents to pass in a direction from the discharge type constant current circuits VC1-VC5, which are connected to the cell modules B1-B5 on the higher potential side of a switch SW1, to the current-voltage converter circuits CV1-CV5, and so as to prevent currents in a direction from the current-voltage converter circuits CV1-CV5 to the discharge type constant current circuits VC1-VC5. For example, the diode D1 is provided so as to prevent the current in the direction from the current-voltage converter circuit CV1 to the discharge type constant current circuit VC1, and the diode D2 is provided so as to prevent the current in the direction from the current-voltage converter circuit CV2 to the discharge type constant current circuit VC2.

In the cell voltage detecting circuit 12, a switch SW1 to cut off the middle point of the cell modules B1-B10, which constitute the battery pack BB, is further provided. Also, each of the cell modules B1-B10 is connected to each of the discharge type constant current circuits VC1-VC10, and each of the current-voltage converter circuits CV1-CV10, which are operated with reference to a low end of the cell module B10 at the lowest potential as a reference point (GND), is correspondingly connected to each of the discharge type constant current circuits VC1-VC10.

That is, each of anodes of the diodes D1-D5 is connected to each of the discharge type constant current circuits VC1-VC5 on the higher potential side of the switch SW1 to cut off the middle point, and each of cathodes of the diodes D1-D5 is connected to each of the corresponding current-voltage converter circuits CV1-CV10.

With the switch SW1 turned on, because potentials of all of the discharge type constant current circuits VC1-VC10 are higher than those of the corresponding current-voltage converter circuits CV1-CV10, currents flow in the direction from the discharge type constant current circuits VC1-VC5 to the current-voltage converter circuits CV1-CV5. Also, in a detecting system for the cell modules B1-B5 on the higher potential side of the switch SW1, with the switch SW1 turned on, because potentials of the discharge type constant current circuits VC1-VC5 are higher than those of the corresponding current-voltage converter circuits CV1-CV5, currents flow in a forward direction from the discharge type constant current circuits VC1-VC5 to the current-voltage converter circuits CV1-CV5 through the diodes D1-D5. At this time, although a forward voltage drop of each of the diodes D1-D5 is on the order of 0.6 volts, a measurement accuracy of voltage detection is not substantially affected because each of the discharge type constant current circuits VC1-VC5 is in a feedback operation.

Also, with the switch SW1 turned off, because each of the discharge type constant current circuits VC6-VC10 on the lower potential side of the switch SW1 is in the same condition as that when the switch SW1 is turned on, a current flows in a direction from each of the discharge type constant current circuits VC6-VC10 to each of the corresponding current-voltage converter circuits CV6-CV10.

On the other hand, with respect to the discharge type constant current circuits VC1-VC5 on the higher potential side of the switch SW1, because a potential of each of minus terminals of the cell modules B1-B5 drops to a lower potential than that of each of reference points (ground) of the corresponding current-voltage converter circuits CV1-CV5 by a load resistor R1, a backward voltage is applied to each of the diodes D1-D5 each of which connects each of the discharge type constant current circuits VC1-VC5 to each of the current-voltage converter circuits CV1-CV5 in a forward direction. Therefore, because a backward current is prevented from flowing from each of the current-voltage converter circuits CV1-CV5 to each of the discharge type constant current circuits VC1-VC5 by each of the diodes D1-D5, a current which causes a discharge at each of the cell modules B1-B5 is not generated. Also, a negative voltage is not applied to each of the operational amplifiers U11 of the current-voltage converter circuits CV1-CV5.

More particularly, in the cell voltage detecting circuit 12, in the case where the switch SW1 is opened, on the higher potential side of the switch SW1, a potential of a minus terminal (i.e., a minus terminal of the cell module Bn in question) of a input side of the discharge type constant current circuit VCn (see FIG. 2) is lower than that of GND of the current-voltage converter circuit CVn (first example)(see FIG. 3A). As a result, a current tends to flow back from GND of the current-voltage converter circuit CVn (see FIG. 3A) to the input side of the discharge type constant current circuit VCn (see FIG. 2) of the minus terminal. However, because backflow prevention diodes Dn (i.e., diodes D1-D5) are inserted between the output terminal Iout of the discharge type constant current circuit VCn (see FIG. 2) and the input terminal Iin of the current-voltage converter circuit CVn (see FIG. 3A), a backflow current (i.e., a discharge current of each of the cell modules B1-B5) is prevented.

According to the cell voltage detecting circuit 12 of the second embodiment, when the switch SW1 located at any middle point of the cell modules B1, B2, . . . , B12 is cut off, it is possible to suppress increasing in a quantity of discharge from a portion of the cell modules Bn. That is, when the switch SW1 is cut off, it is possible to suppress a discharge current from any cell module Bn via the current-voltage converter circuit CVn and the discharge type constant current circuit VCn.

That is, according to the cell voltage detecting circuit 12 of the second embodiment, even though the switch SW1 is located at the middle point of the cell modules B1, B2, ..., B10 to divide the voltage of the battery pack BB in half, it is possible to suppress increasing in a quantity of discharge from the cell modules B1, B2, ..., B10 when the switch SW1 is cut off.

Third Embodiment

Figure 7:
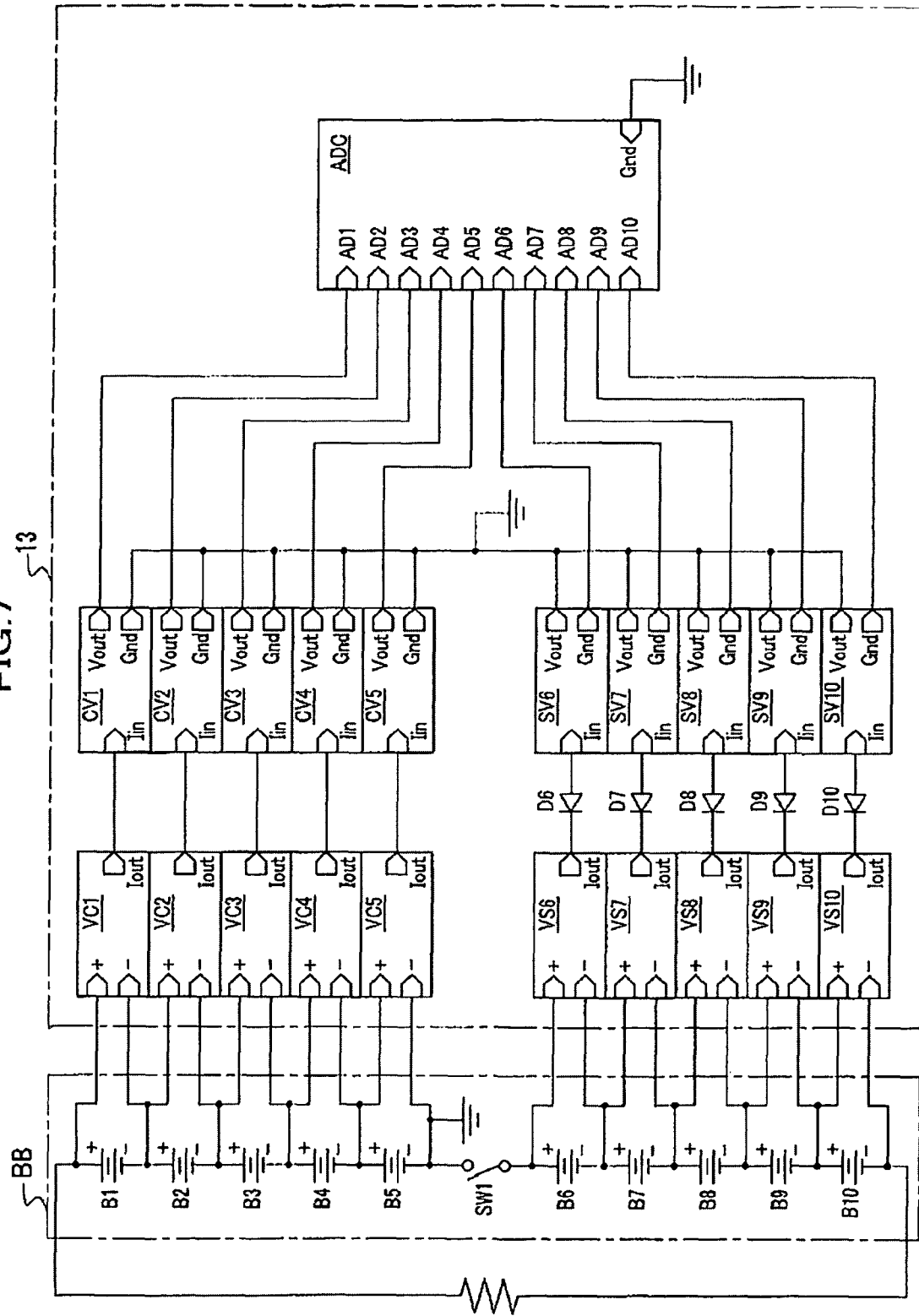
FIG. 7 is a block diagram of a cell voltage detecting circuit of a third embodiment according to the present invention.

FIG. 7 is a block diagram of a cell voltage detecting circuit 13 of a third embodiment according to the present invention.

As shown in FIG. 7, the switch SW1 is located at a middle point of the cell modules B1-B10, the discharge type constant current circuits VC1-VC5 are connected to the corresponding cell modules B1-B5, and the induction type constant current circuits VS6-VS10 are connected to the corresponding cell modules B6-B10. Further, the current-voltage converter circuits CV1-CV5, which are operated with reference to a pole (upper pole) on the higher potential side of the switch SW1 as a reference point (ground), are connected to the discharge type constant current circuits VC1-VC5 respectively, and the current-voltage converter circuits SV6-SV10 are connected to the induction type constant current circuits VS6-VS10 respectively. Also, diodes D6-D10 are connected respectively in a direction from the current-voltage converter circuits SV6-SV10 to the corresponding induction type constant current circuits VS6-VS10.

According to the cell voltage detecting circuit 13, as with the cell voltage detecting circuit 11 of the first embodiment (see FIG. 1), the P-channel FETs (M1) of the discharge type constant current circuits VC1-VC5 (see FIG. 2) and the N-channel FETs (M2) of the induction type constant current circuits VS6-VS10 (see FIG. 4) may have voltage endurance which is more than half of that of the total voltage of the battery pack BB.

Also, with the switch SW1 turned on, the circuits on the higher potential side of the switch SW1 are operated in the same manner as that of the first embodiment. In the circuits on the lower potential side of the switch SW1, because the potentials of the induction type constant current circuits VS6-VS10 are lower than those of the corresponding current-voltage converter circuits SV6-SV10 respectively, each of currents flows through each of the diodes D6-D10 in a forward direction. Although forward voltage drop of each of the diodes D6-D10 is on the order of 0.6 volts, a measurement accuracy of voltage detection is not substantially affected because each of the induction type constant current circuits VS6-VS10 is in a feedback operation.

Also, with the switch SW1 turned off, because potentials between the discharge type constant current circuits VC1-VC5 and the corresponding current-voltage converter circuits CV1-CV5 do not change, the circuits on the higher potential side of the switch SW1 are operated in the same manner as those when the switch SW1 is turned on. On the other hand, with respect to the circuits on the lower potential side of the switch SW1, because a potential of a minus terminal of the cell module B10 becomes the same as that of a plus terminal of the cell module B1 by the load resistor R1, a potential of a plus terminal of the cell module B6 becomes higher than that of the higher potential side of the switch SW1 which is set to the reference potential (GND) (i.e., a minus terminal of the cell module B5) by 200 volts.

Also, each potential of each of the cell modules B7-B10 becomes higher than that of the reference point by more than 100 volts. Therefore, although a large potential difference is generated between each of the induction type constant current circuits VS6-VS10 connected to each of the cell modules B6-B10 on the lower potential side of the switch SW1 and each of the current-voltage converter circuits SV6-SV10, because each of the diodes D6-D10 inserted between each of the induction type constant current circuits VS6-VS10 and each of the current-voltage converter circuits SV6-SV10 prevents a backward current, a discharge current from each of the cell modules B6-B10 is suppressed. That is, a high voltage applied to each of the current-voltage converter circuits is suppressed.

According to the cell voltage detecting circuit 13 of the third embodiment, in the cell voltage detecting circuit 11 of the first embodiment shown in FIG. 1, because the switch SW1 is inserted between the discharge type constant current circuits VC1-VC5 and the induction type constant current circuits VS6-VS10, when the switch SW1 is cut off, it is possible to suppress a discharge current from any cell module Bn via the current-voltage converter circuit CVn and the induction type constant current circuit VSn.

Fourth Embodiment

Figure 8:
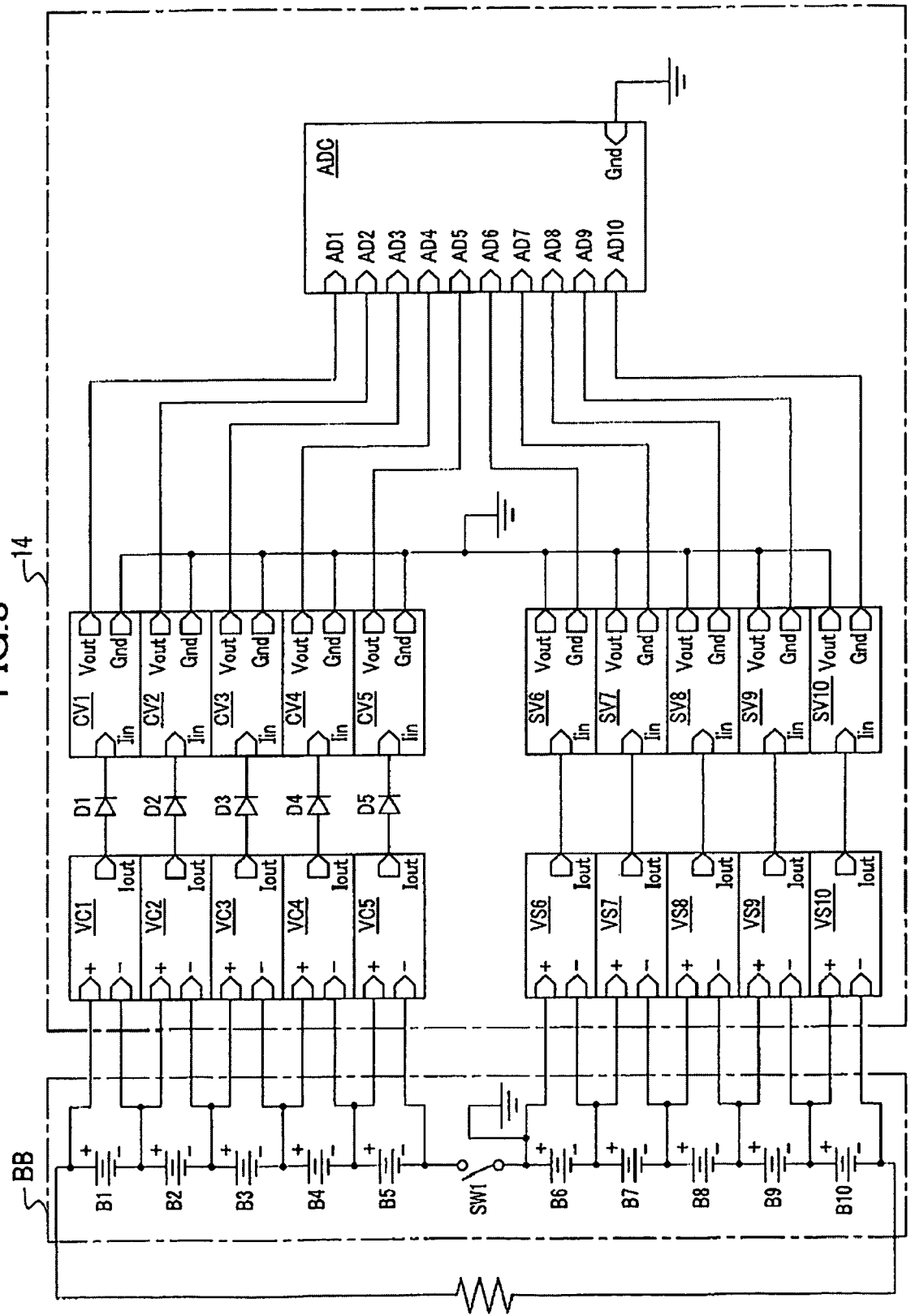
FIG. 8 is a block diagram of a cell voltage detecting circuit of a fourth embodiment according to the present invention.

FIG. 8 is a block diagram of a cell voltage detecting circuit 14 of a fourth embodiment according to the present invention.

In the third embodiment shown in FIG. 7, the discharge type constant current circuits VC1-VC5 and the induction type constant current circuits VS6-VS10 are divided by the cell module B5 and the cell module B6, the switch SW1 is located between the cell module B5 and the cell module B6, and GND is provided on the higher potential side of the switch SW1. However, in the fourth embodiment, GND is provided on the lower potential side of the switch SW1.

That is, as shown in FIG. 8, the switch SW1 is located at the middle point of the cell modules B1-B10, each of the discharge type constant current circuits VC1-VC5 is correspondingly connected to each of the cell modules B1-B5, and each of the induction type constant current circuits VS6-VS10 is correspondingly connected to each of the cell modules B6-B10. Further, each of the current-voltage converter circuits CV1-CV5, which are operated with reference to an electrode on the lower potential side of the switch SW1 as a reference potential (GND), is correspondingly connected to each of the discharge type constant current circuits VC1-VC5, and each of the current-voltage converter circuits SV6-SV10 is correspondingly connected to each of the induction type constant current circuits VS6-VS10. Also, each of the diodes D1-D5 is correspondingly connected in a direction from each of the discharge type constant current circuits VC1-VC6 to each of the current-voltage converter circuits CV1-CV5.

In this cell voltage detecting circuit 14, with the switch SW1 turned on, the circuits on the lower potential side of the switch SW1 are operated in the same manner as that of the cell voltage detecting circuit 11 of the first embodiment shown in FIG. 1. In the circuits on the higher potential side of the switch SW1, because the potentials of the discharge type constant current circuits VC1-VC5 are higher than those of the corresponding current-voltage converter circuits CV1-CV5 respectively, each of currents flows through each of the diodes D1-D5 in a forward direction. At this time, although forward voltage drop of each of the diodes D1-D5 is on the order of 0.6 volts, a measurement accuracy of voltage detection is not substantially affected because each of the discharge type constant current circuits VC1-VC5 is in a feedback operation.

On the other hand, with the switch SW1 turned off, because potentials between the current-voltage converter circuits SV6-SV10 and the corresponding induction type constant current circuits VS6-VS10 do not change, the circuits on the lower potential side of the switch SW1 are operated in the same manner as those when the switch SW1 is turned on. Also, with respect to circuits on the higher potential side of the switch SW1, because a potential of the plus terminal of the cell module B1 becomes the same as that of the minus terminal of the cell module B10 by the load resistor R1, a potential of the minus terminal of the cell module B5 becomes lower than that of the switch SW1 which is set to the reference potential (GND) by 200 volts. Also, each potential of the cell modules B1-B4 becomes lower than that of the reference point (GND) by greater than or equal to 100 volts.

Therefore, in the circuits on the higher potential side of the switch SW1, although a large negative potential difference is generated between each of the discharge type constant current circuits VC1-VC5 connected to the cell modules B1-B5 and each of the current-voltage converter circuits CV1-CV5, a backward current is prevented from flowing from each of the current-voltage converter circuits CV1-CV5 to each of the corresponding discharge type constant current circuits VC1-VC5 by each of the diodes D1-D5. Therefore, a discharge current passing through each of the cell modules B1-B5 is suppressed. That is, a negative voltage is not applied to each of the current-voltage converter circuits CV1-CV5.

In addition, in the case where the battery pack BB is made up of even numbers of cell modules B1, B2, . . . , the reference point is preferably provided at a center point of the battery pack BB so as to evenly divide the cell modules B1, B2, . . . . In the case where the battery pack BB is made up of odd numbers of cell modules B1, B2, the reference point is provided near the center point so as to approximately evenly divide the cell modules B1, B2, . . . . In the case where the reference point is provided as above, it is possible to make voltage endurances of semiconductor devices for output (such as, the P-channel FET (M1) shown in FIG. 2 and the N-channel FET (M2) shown in FIG. 4) to one-half or approximately one-half of the total voltage of the battery pack BB. The more the reference point comes close to the center point, the less the voltage endurance of the semiconductor device for output will be. When the reference point is provided at any mutual connection point of the cell modules 2, except the plus terminal of the cell module 2 at the highest potential (the plus terminal of the battery pack BB) and the minus terminal of the cell module 2 at the lowest potential (the minus terminal of the battery pack BB), it is possible to make the voltage endurance of the semiconductor device for output lower than the total voltage of the battery pack BB.

First Comparative Example

Figure 9:
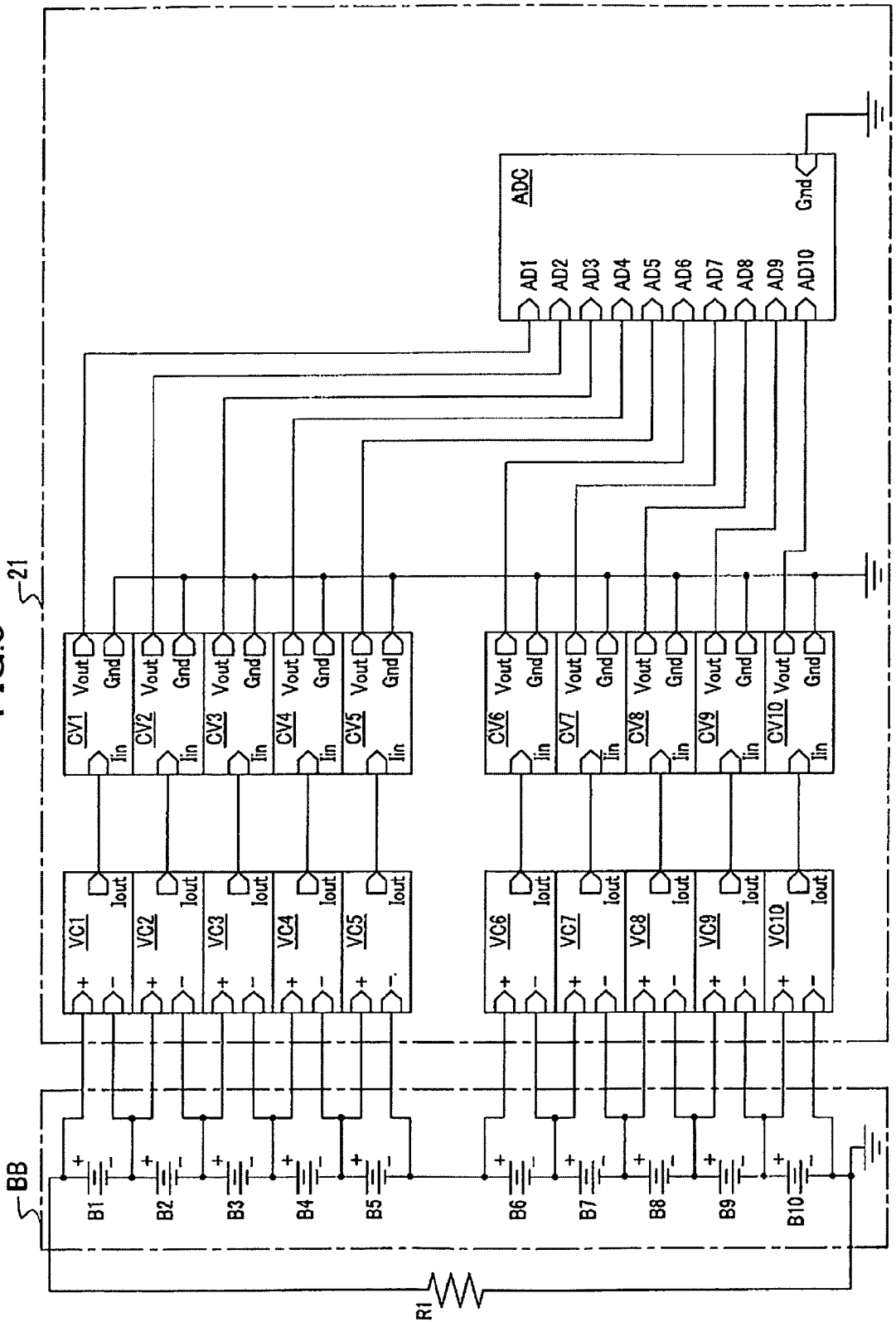
FIG. 9 is a block diagram of a cell voltage detecting circuit of a first comparative example.

FIG. 9 is a block diagram of a cell voltage detecting circuit 21 of a first comparative example.

Each of the module voltages V1, V2, . . . , V10, which are voltages between terminals of the cell modules B1, B2, . . . , B10, is detected by each of series circuits, each of which is made up of each of the discharge type constant current circuits VC1, VC2, . . . , VC10 and each of the current-voltage converter circuits CV1, CV2, . . . , CV10, and is outputted to each of module voltage monitoring terminals AD1, AD2, . . . , AD10 of the voltage monitoring circuit ADC. In addition, the minus terminal of the cell module B10 at the lowest potential of the battery pack BB is connected to GND, and the resistor R1 which simulates a load of the battery pack BB is connected between the plus terminal of the cell module B1 at the highest potential of the battery pack BB and the minus terminal of the cell module B10 at the lowest potential (GND).

In this cell voltage detecting circuit 21, for example, the module voltage V1 of the cell module B1 is converted into a current by the discharge type constant current circuit VC1, is further converted into a voltage which is proportional to the module voltage V1 of the cell module B1 by the current-voltage converter circuit CV1, and is outputted to the module voltage monitoring terminal AD1 of the voltage monitoring circuit ADC. Also, the module voltage V2 of the cell module B2 is converted into a current by the discharge type constant current circuit VC2, is further converted into a voltage which is proportional to the module voltage V2 of the cell module B2 by the current-voltage converter circuit CV2, and is outputted to the module voltage monitoring terminal AD2 of the voltage monitoring circuit ADC. Hereinafter, each of the module voltages V3, V4, . . . , V10 of each of the cell modules B3, B4, . . . , B10 is detected in the same manner.

In this cell voltage detecting circuit 21, for example, when each of the module voltages V1, V2, . . . , V10 of each of the cell modules B1, B2, . . . , B10 is set to 20 volts, the P-channel FET (M1) (see FIG. 2), which is an output device of the discharge type constant current circuit VC1 connected to the cell module B1, requires a voltage endurance more than or equal to 200 volts. That is, because the lowest potential minus terminal of the battery pack BB which is made up of the cell modules B1, B2, . . . , B10 is set to the reference potential (GND), and the discharge type constant current circuits VC1, VC2, . . . , VC10 are serially connected (see FIG. 2), a voltage, which is obtained by multiplying the voltage per the cell module (B1, etc.) by the number of cell modules (B1, etc.) which constitutes the battery pack BB, is applied to the P-channel FET (M1) of the discharge type constant current circuit VC1 located at the highest potential. The P-channel FET (M1) requires the voltage endurance to endure this applied voltage. Because each of the discharge type constant current circuits VC1, VC2, . . . , VC10 requires the semiconductor device (P-channel FET) having high voltage endurance, parts procurement may become difficult to obtain and the product price may become expensive.

Second Comparative Example

Figure 10:
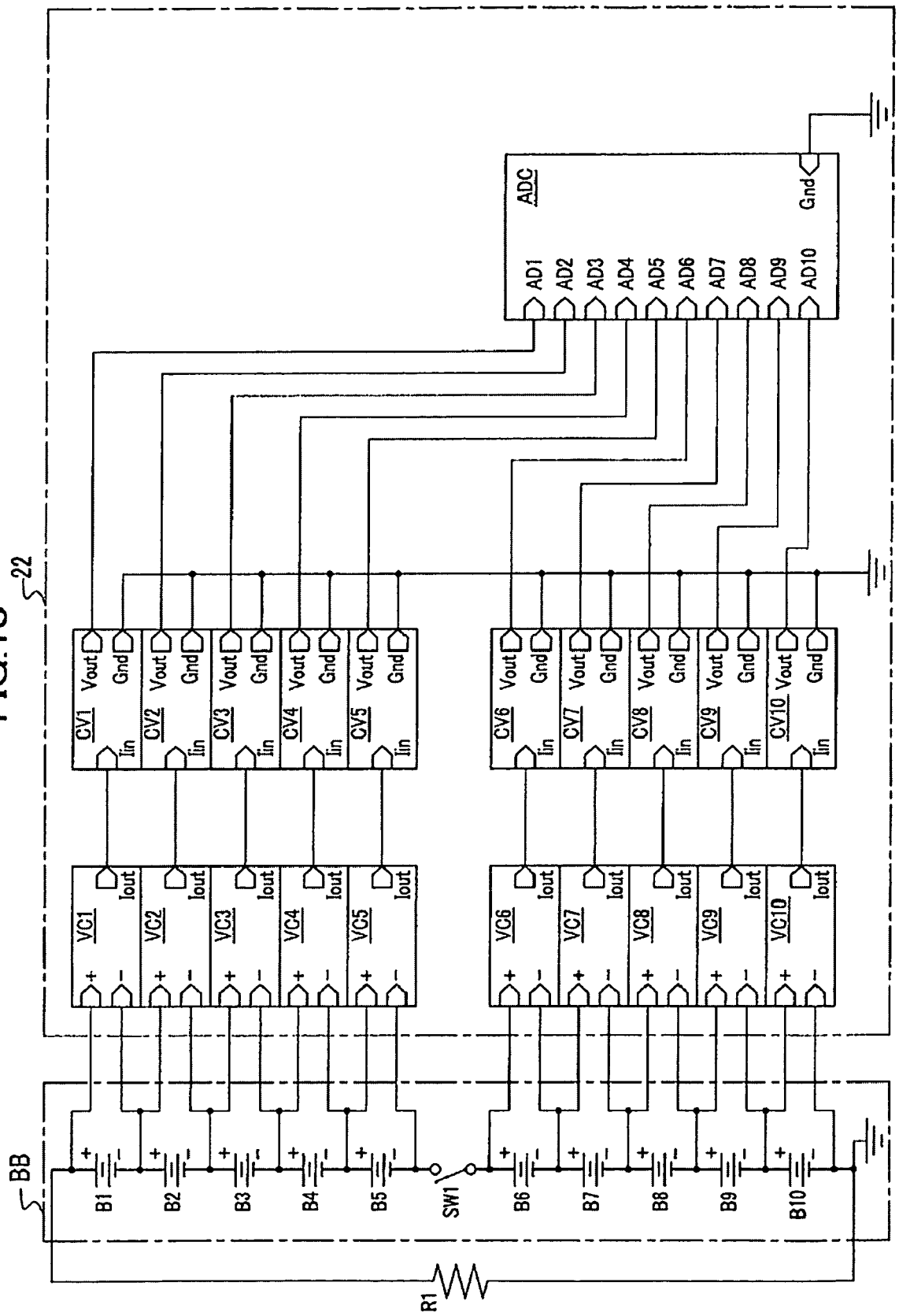
FIG. 10 is a block diagram of a cell voltage detecting circuit of a second comparative example.

FIG. 10 is a block diagram of a cell voltage detecting circuit 22 of a second comparative example.

This cell voltage detecting circuit 22 has a configuration in which the switch SW1 is provided at the middle point of the cell modules B1-B10 (i.e., between the cell module B5 and the cell module B6) in the cell voltage detecting circuit 21 shown in FIG. 9.

In this cell voltage detecting circuit 22, because the resistor R1 is connected between both ends of the cell modules B1-B10, when the cell modules B1-B10 are cut off by the switch SW1 at the middle point, if the lower end of the cell module B10 is connected to GND, the upper end potential of the cell module B1 becomes zero. For this reason, the potential just above the cut-off point by the switch SW1 (i.e., the minus terminal of the cell module B5) becomes less than zero. That is, with the switch SW1 turned off, the potential of the plus terminal of the cell module B1 becomes equal to that of the minus terminal of the cell module B10 by the resistor R1. As a result, provided that the voltage per one of the cell modules B1, B2, . . . , B10 is 20 volts, the potential of the minus terminal of the cell module B5 becomes –100 volts. Likewise, the potential of the minus terminal of the cell module B4 becomes –80 volts, the potential of the minus terminal of the cell module B3 becomes –60 volts, the potential of the minus terminal of the cell module B2 becomes –40 volts, and the potential of the minus terminal of the cell module B1 becomes –20 volts.

Therefore, even if the switch SW1 is turned off, a discharge current continues passing through the cell modules B1-B5 on the higher potential side of the switch SW1. For example, in the cell module B1, because a current continues passing through GND (i.e., the plus terminal of the cell module B1) of the current-voltage converter circuit CV1 (see FIG. 3A), the resistor R100, a parasitic diode of the P-channel FET (M1) of the discharge type constant current circuit VC1 (see FIG. 2), the operational amplifier U1, and the minus terminal of the cell module B1, a quantity of discharge from the cell module B1 is increased (first example). In the cell modules B2-B5, the discharge current continues passing through like paths. Also, in the cell voltage detecting circuit 22 shown in FIG. 10, because a negative voltage is applied to the operational amplifier U11 used in each of the current-voltage converter circuits CV1-CV5 connected to each of the cell modules B1-B5, the protection circuit is needed to be added, and current-voltage converting accuracy is deteriorated.

What is claimed is:

1. A cell voltage detecting apparatus connected to a battery pack made up of a plurality of serially connected cell modules each of which is made up of one or more cells, for detecting a voltage between terminals of the cell module comprising:
    discharge type constant current circuits where any one of mutual connection points of the cell modules except both ends of the battery pack is used as a middle point, a potential of the middle point is set to a reference potential, each of the discharge type constant current circuits is provided for each of the cell modules on a higher potential side of the middle point and outputs a current representative of a voltage of the cell module;
    first current-voltage converter circuits each of which is provided for each of the discharge type constant current circuits and converts the current outputted from the discharge type constant current circuit to a voltage;
    induction type constant current circuits each of which is provided for each of the cell modules on a lower potential side of the middle point and outputs a current representative of a voltage of the cell module; and
    second current-voltage converter circuits each of which is provided for each of the induction type constant current circuits and converts a current outputted from the induction type constant current circuit to a voltage.

2. A cell voltage detecting apparatus according to claim 1 further comprising:
    a cut-off switch provided between the middle point and a terminal of the cell module on the lower potential side of the middle point; and
    diodes each of which is inserted between the induction type constant current circuit and the second current-voltage converter circuit for locating a cathode at an output terminal of the induction type constant current circuit, and for locating an anode at an input terminal of the second current-voltage converter circuit.

3. A cell voltage detecting apparatus according to claim 1 further comprising:
    a cut-off switch provided between the middle point and a terminal of the cell module on the higher potential side of the middle point; and
    diodes each of which is inserted between the discharge type constant current circuit and the first current-voltage converter circuit for locating an anode at an output terminal of the discharge type constant current circuit, and for locating a cathode at an input terminal of the first current-voltage converter circuit.

4. A cell voltage detecting apparatus connected to a battery pack made up of a plurality of serially connected cell modules each of which is made up of one or more cells, for detecting a voltage between terminals of the cell module comprising:
    discharge type constant current circuits where one terminal having the lowest potential of all is set to the reference potential, any one of mutual connection points of the cell modules except both ends of the battery pack is used as a middle point, a cut-off switch is provided at the middle point, each of the discharge type constant current circuits is provided for each of the cell modules and outputs a current representative of a voltage of the cell module;
    current-voltage converter circuits each of which is provided for each of the discharge type constant current circuits and converts the current outputted from the discharge type constant current circuit into a voltage; and
    diodes each of which is inserted between an output terminal of the discharge type constant current circuit connected to the cell module on the lower potential side of the middle point and the current-voltage converter circuit connected to the discharge type constant current circuit for locating an anode at an output terminal of the discharge type constant current circuit, and for locating a cathode at an input terminal of the current-voltage converter circuit.

* * * * *